United States Patent
Liu et al.

[11] Patent Number: 6,147,378
[45] Date of Patent: Nov. 14, 2000

[54] FULLY RECESSED SEMICONDUCTOR DEVICE AND METHOD FOR LOW POWER APPLICATIONS WITH SINGLE WRAP AROUND BURIED DRAIN REGION

[75] Inventors: Yowjuang W. Liu, San Jose; Donald L. Wollesen, Saratoga, both of Calif.

[73] Assignee: Advanced Micro Devices, Inc., Sunnyvale, Calif.

[21] Appl. No.: 09/052,060

[22] Filed: Mar. 30, 1998

[51] Int. Cl.[7] .......................... H01L 29/788; H01L 29/76; H01L 27/108

[52] U.S. Cl. .......................... 257/316; 257/301; 257/302; 257/303; 257/304; 257/305; 257/314; 257/288; 257/330; 257/333; 257/905; 257/68

[58] Field of Search .......................... 257/316, 314, 257/301, 288, 302–305, 330, 333, 905, 68

[56] References Cited

U.S. PATENT DOCUMENTS

| | | | |
|---|---|---|---|
| Re. 35,810 | 5/1998 | Prall | 438/257 |
| 4,271,418 | 6/1981 | Hiltpold | 357/23 |
| 4,835,741 | 5/1989 | Baglee | 365/185 |
| 5,146,426 | 9/1992 | Mukherjee et al. | 365/149 |
| 5,315,142 | 5/1994 | Acovie et al. | 257/316 |
| 5,341,342 | 8/1994 | Brahmbhatt | 365/182 |
| 5,429,970 | 7/1995 | Hong | 437/43 |
| 5,488,244 | 1/1996 | Quek et al. | 257/314 |
| 5,729,496 | 3/1998 | Jung | 365/185.26 |
| 5,770,484 | 6/1998 | Kleinhenz | 438/115 |
| 5,801,075 | 9/1998 | Gardner et al. | 438/197 |
| 5,854,114 | 12/1998 | Li et al. | 438/296 |
| 5,859,459 | 1/1999 | Ikeda | 257/374 |
| 5,915,180 | 6/1999 | Hara et al. | 438/270 |
| 5,923,063 | 7/1999 | Liu et al. | 257/316 |

*Primary Examiner*—Mahshid Saadat
*Assistant Examiner*—Matthew Warren
*Attorney, Agent, or Firm*—Fenwick & West LLP

[57] ABSTRACT

A fully recessed device structure and method for low power applications comprises a trenched floating gate, a trenched control gate and a single wrap around buried drain region. The trenched floating gate and the trenched control gate are formed in a single trench etched into a well junction region in a semiconductor substrate to provide a substantially planar topography. The fully recessed structure further comprises a buried source region, and a buried drain region that are each formed in the well junction region laterally separated by the trench. The upper boundaries of the buried source region and the buried drain region are of approximately the same depth as the top surface of the trenched floating gate. In one embodiment of the present invention the buried drain region has a lower boundary which partially extends laterally underneath the bottom surface of the trench to form a drain junction disposed along portions of the sidewall and bottom of the trench, and the buried source region has a lower boundary which is approximately less than the depth of the trench. In another embodiment of the present invention the buried source region has a lower boundary which partially extends laterally underneath the bottom surface of the trench to form a source junction disposed along portions of the sidewall and bottom of the trench, and the buried drain region has a lower boundary which is approximately less than the depth of the trench. In one embodiment of the present invention, sidewall dopings are formed in the substrate to shield the trenched control gate from the buried source and buried drain regions.

14 Claims, 8 Drawing Sheets

FULLY RECESSED SEMICONDUCTOR DEVICE AND METHOD FOR LOW POWER APPLICATIONS WITH SINGLE WRAP AROUND BURIED DRAIN REGION

RELATED APPLICATIONS

The subject matter of this application is related to the subject matter of commonly-assigned U.S. patent applications having the following serial numbers and titles: Ser. No. 09/052,059, "Fully Recessed Semiconductor Device and Method"; and Ser. No. 09/052,061, "Fully Recessed Semiconductor Device and Method for Low Power Applications", all concurrently filed herewith.

FIELD OF THE INVENTION

The subject matter of this invention relates to semiconductor devices and methods of manufacture, and more particularly, to semiconductor devices and methods of manufacture having a trenched floating gate and a trenched control gate.

BACKGROUND OF THE INVENTION

Conventional semiconductor non-volatile memories, such as read-only memories (ROMs), erasable-programmable ROMs (EPROMs), electrically erasable-programmable ROMs (EEPROMs) and flash EEPROMs are typically constructed using a double-gate structure. FIG. 1 is a cross-sectional view of the device structure of a conventional nonvolatile memory device 100 including a substrate 102 of a semiconductor crystal such as silicon. The device 100 further includes a channel region 104, a source region 106, a drain region 108, a floating gate dielectric layer 110, a floating gate electrode 112, an inter-gate dielectric layer 114, and a control gate electrode 116. The floating gate dielectric layer 110 isolates the floating gate electrode 112 from the underlying substrate 102 while the inter-gate dielectric 114 isolates the control gate electrode 116 from the floating gate electrode 112. As shown in FIG. 1, the floating gate dielectric layer 110, the floating gate electrode 112, the inter-gate dielectric layer 114, and the control gate electrode 116 are all disposed on the surface of the substrate 102.

As semiconductor devices and integrated circuits are scaled down in size, demands for the efficient use of space have increased. Heretofore, conventional semiconductor memories have utilized a double-gate structure in which both gates being formed on the surface of the silicon substrate as shown in FIG. 1. This type of device structure for non-volatile devices is limited to the degree to which active devices can be made smaller in order to increase packing density. Moreover, when the double gates are stacked on top of the substrate surface as shown in FIG. 1, difficulties in the subsequent contact etch process are created due to the uneven and non-uniform topology.

SUMMARY OF THE INVENTION

In accordance with the present invention, a semiconductor device for low power applications is fabricated to include a fully recessed cell structure comprising a trenched floating gate, a trenched control gate, and a single wrap around buried drain region. A fully recessed trenched gate structure embodying the principles of the present invention provides a substantially planar topography that improves the packing density and scaleability of the device. Additionally, the present invention provides low substrate current programming and an enhanced erase operation.

In one embodiment of the present invention, a fully recessed trenched gate device structure for a non-volatile semiconductor device includes a well junction region and a trench etched into the well junction region. The fully recessed trenched gate structure comprises a trenched floating gate and a trenched control gate both formed in the trench. The trenched floating gate is electrically isolated from the trench by a trench-to-gate dielectric layer formed on substantially vertical sidewalls and on a bottom surface inside the trench. An inter-gate dielectric layer is formed on the trenched floating gate and electrically isolates the trenched floating gate from the trenched control gate. The trenched control gate is formed inside the trench on the inter-gate dielectric layer and in a preferred embodiment, has a top surface which is substantially planar with a surface of the substrate. A buried source region and a buried drain region are also formed in the well junction region and are laterally separated by the fully recessed trenched gate structure. The upper boundaries of the buried source region and the buried drain region are of approximately the same depth as the top surface of the trenched floating gate. In one embodiment of the present invention the buried drain region has a lower boundary which partially extends laterally underneath the bottom surface of the trench to form a drain junction disposed along portions of the sidewall and bottom of the trench. The buried source region has a lower boundary which is approximately less than the depth of the trench. In another embodiment of the present invention the buried source region has a lower boundary which partially extends laterally underneath the bottom surface of the trench to form a source junction disposed along portions of the sidewall and bottom of the trench. The buried drain region has a lower boundary which is approximately less than the depth of the trench.

In one embodiment of the present invention, sidewall dopings of one conductivity type are formed in the semiconductor substrate. The sidewall dopings are immediately contiguous the vertical sidewalls of the trench and immediately contiguous the substrate surface. The depth of the sidewall dopings is approximately equal to or greater than the depth of the trenched control gate and partially extend into the buried source and buried drain regions.

In another embodiment of the present invention, an implanted region of one conducting type is formed in the semiconductor substrate. The implanted region is laterally separated by the trench and is immediately contiguous the substantially vertical sidewalls of the trench, the substrate surface and the upper boundaries of the buried source region and the buried drain region.

In accordance with the present invention, a fully recessed device structure is formed in a semiconductor substrate using an MOS fabrication process according to which a well junction region is formed in the substrate. A trench is then etched into the well junction region. A trench-to-gate insulating layer is formed on substantially upright vertical sidewalls and on a bottom surface inside the trench. A trenched floating gate is fabricated by first depositing a layer of polysilicon over the substrate and then etching the polysilicon layer. An inter-gate dielectric is then deposited on the trenched floating gate inside the trench to isolate the two gate electrodes. The trenched control gate is formed by first depositing a layer of polysilicon over the substrate and then planarizing the polysilicon layer until it is substantially planar with the substrate surface. Finally, a buried source region and a buried drain region are formed in the well junction region. In one embodiment, sidewall dopings are formed in the substrate and are immediately contiguous the vertical sidewalls of the trench and the substrate surface.

DESCRIPTION OF THE PREFERRED EMBODIMENT

Figure 1:
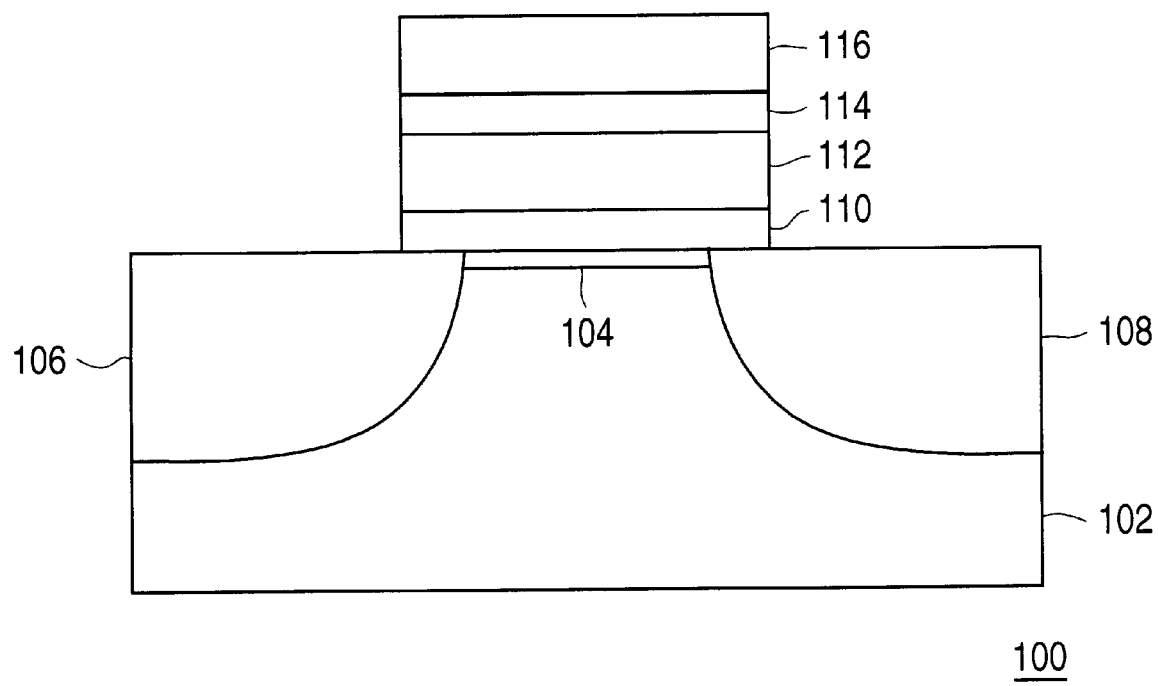
FIG. 1 is a cross-sectional view of a conventional non-volatile device.
Figure 2A:
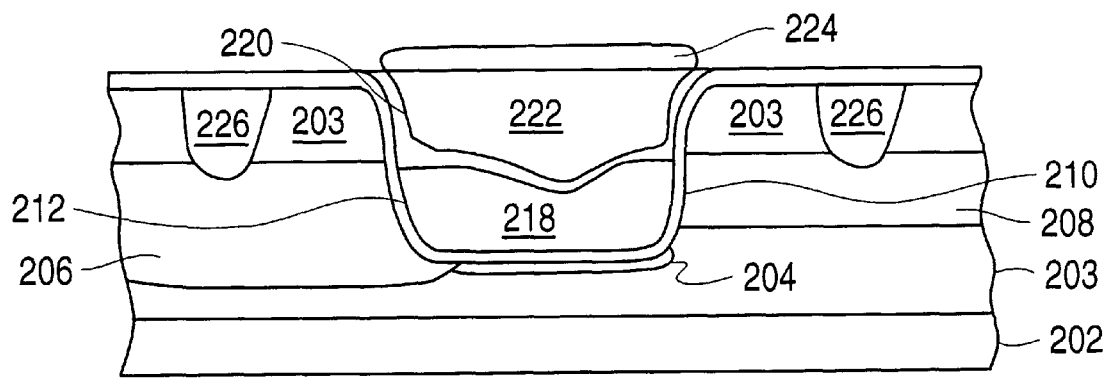
FIGS. 2A–2D are cross-sectional views of a device structure embodying the principles of the present invention.

FIG. 2A is a cross-sectional view of one embodiment of a non-volatile device embodying the principles of the present invention. FIG. 2A shows a semiconductor structure 200 including a substrate 202 of monocrystalline silicon semiconductor material. The substrate 202 is preferably n-doped or provided with an n-well to a suitable threshold voltage level in accordance with conventional silicon semiconductor fabrication techniques. Semiconductor structure 200 also includes a well junction region 203, preferably p-type, formed in semiconductor substrate 202. Structure 200 also includes a channel region 204, a buried source region 206, a buried drain region 208, a trench 210, and a trench-to-gate insulating layer 212. Structure 200 further includes a trenched floating gate electrode 218, an inter-gate dielectric layer 220 formed in trench 210, and a trenched control gate electrode 222. Trenched control gate electrode 222 is formed over inter-gate dielectric layer 220 and in a preferred embodiment has a top surface which is substantially planar with a top surface of substrate 202. In one embodiment of the present invention, a layer of tungsten silicide 224 is formed on the top surface of substrate 202. Source and drain contacts 226 are also formed in the substrate and partially extend into the buried source and buried drain regions 206, 208.

Buried source region 206 and buried region 208 are diffusion regions of semiconductor material that are doped with impurities that have a conductivity opposite to the conductivity of well junction region 203. For example, when well junction region 203 is p-type, then the opposite conductivity type for buried source region 206 and buried drain region 208 is n-type. Preferably buried source region 206 and buried drain region 208 are doped with "donor" or n-type impurities of phosphorous, arsenic or the like in conventional manner with a dose range on the order of approximately 5E14 atoms $cm^{-2}$ to approximately 1E16 atoms $cm^{-2}$. Buried source region 206 and buried drain region 208 are laterally separated by trench 210 and are immediately contiguous the substantially upright vertical sidewalls of trench 210. Buried source region 206 and buried drain region 208 are diffusion regions which have an upper boundary below the top surface of the substrate. The upper boundaries, i.e., the boundaries closest to the top surface of the semiconductor substrate, of buried source region 206 and buried drain region 208 are disposed at approximately the same depth as the top surface of trenched floating gate 218. In one embodiment, buried source region 206 has a lower boundary, i.e. the boundary closest to a bottom surface of the semiconductor substrate, which partially extends laterally underneath the bottom surface of the trench to form a source junction disposed along portions of the lower sidewall and bottom of trench 210 while the lower boundary of buried drain region 208 is approximately less than the depth of trench 210 as shown in FIG. 2A. The diffusion of buried source region 206 disposed along portions of the lower sidewall and bottom of trench 210 is a corner-limiting diffusion process which improves the uniformity and controllability of the lateral diffusion of the buried source region 206 under the trenched gate structure. This corner-limiting diffusion process is described below in more detail with reference to FIG. 3J. In such embodiment, channel region 204 is immediately contiguous the buried source region 206 disposed underneath the bottom of the trench.

Figure 2B:
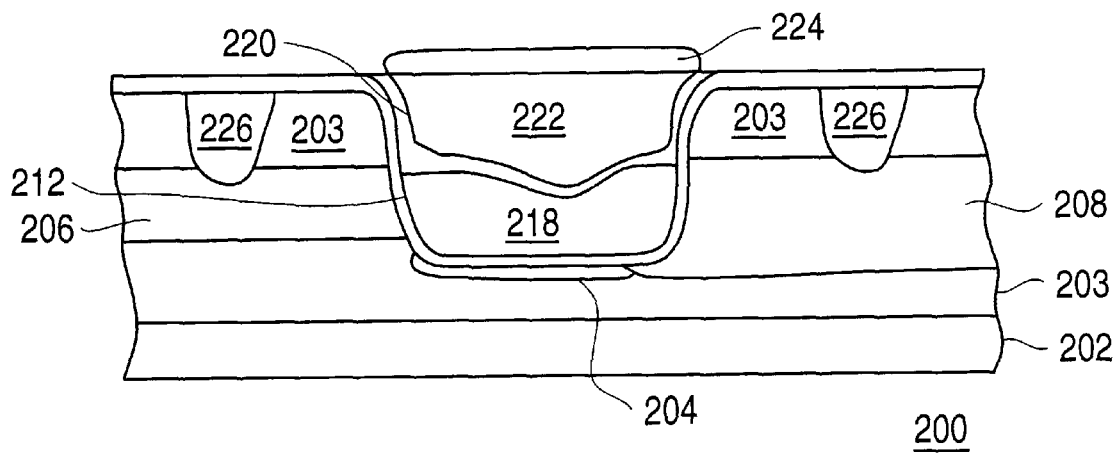

In another embodiment, buried drain region 208 has a lower boundary which partially extends laterally underneath the bottom surface of the trench to form a drain junction disposed along portions of the lower sidewall and bottom of trench 210 while the lower boundary of buried source region 206 is approximately less than the depth of trench 210 as shown in FIG. 2B. The diffusion of buried drain region 208 that is disposed along portions of the lower sidewall and bottom of trench 210 is a corner-limiting diffusion process which improves the uniformity and controllability of the lateral diffusion of buried drain region 208 under the trenched gate structure. This corner-limiting diffusion process is described below in more detail with reference to FIG. 3J. In such embodiment, channel region 204 is immediately contiguous the buried drain region 208 disposed underneath the bottom of the trench.

Channel region 204 is an implanted region formed beneath the bottom surface of trench 210. In a preferred embodiment, channel region 204 is a depletion type channel region. According to one embodiment of the present invention, trench 210 is between approximately 100 Å and 5000 Å wide and from approximately 100 Å to 5000 Å deep. Trench-to-gate insulating layer 212 is formed on substantially upright vertical sidewalls and a bottom surface inside trench 210 and has preferably a high dielectric constant (K). Preferably, the thickness of trench-to-gate insulating layer 212 is scaled according to the width of trench 210 to comprise only an insignificant part of the dimensions of trench 210. Trench-to-gate insulting layer 212 may comprise a uniform thickness on the vertical sidewalls and the bottom surface of trench 210. Alternatively, the thickness of trench-to-gate insulating layer 212 may be thicker on the vertical sidewalls inside trench 210 than on the bottom surface inside the trench. Trench-to-gate insulating layer 212 is preferably a nitridized thermal oxide, a deposited high temperature oxide (HTO), or composited dielectric films with a K approximately equal to or greater than 4.0. Moreover, trench-to-gate insulating layer 212 may comprise either one film formed on both the substantially upright vertical sidewalls and the bottom surface inside trench 210 or it may comprise one type of film formed on the substantially upright vertical sidewalls inside trench 210 and a different film formed on the bottom surface inside trench 210. Trenched floating gate electrode 218 is formed inside trench 210 on trench-to-gate insulating layer 212 which electrically isolates it from trench 210. Trenched floating gate electrode 218 is a conductive material such as polysilicon, preferably doped with n-type material, or a layer of polysilicide, and has a final thickness which is approximately equal to one half of the depth of trench 210. In other words, a top surface of trenched floating gate electrode 218 is disposed at approximately one half the depth of trench 210. Inter-gate dielectric layer 220 is formed on trenched floating gate electrode 218 inside trench 210 and electrically isolates trenched floating gate electrode 218 from trenched control gate electrode 222. In one embodiment, an additional spacer dielectric may also be formed at the upper sidewalls inside trench 210 in order to further decouple the trenched control gate from the buried source and buried drain regions. Inter-gate dielectric layer 220 is preferably a high K dielectric material, such as an Oxide-Nitride-Oxide (ONO) layer formed in conventional manner on trenched floating gate electrode 218 inside trench 210. Trenched control gate electrode 222 is a conductive material, such as polysilicon, preferably doped with n-type material, or polysilicide formed on inter-gate dielectric layer 220 inside trench 210 and preferably, has a top surface which is substantially planar with a top surface of substrate 202. Trenched control gate electrode 222 substantially fills the remainder of trench 210 and has a final thickness which is approximately equal to one half the depth of trench 210. In a preferred embodiment, a layer of tungsten silicide 224 is also formed on the top surface of trenched control gate electrode 222. Contacts 226 to buried source region 206 and buried drain region 208 may also be formed in the semiconductor substrate and partially extend into buried source region 206 and buried source region 208.

One advantage of the present invention is the substantially planar topography of the fully recessed device structure. The substantially planar topography improves the packing density and scaleability of the device as well as the manufacturability of the device. Because the trenched floating gate electrode and the trenched control gate electrode are both formed in a single trench etched into the semiconductor substrate, the fully recessed device structure is self-aligned. In other words, the trenched control gate electrode and the trenched floating gate electrode are self-aligned, and the trenched gates and the source and drain regions are self-aligned.

Embodiments employing the principles of the present invention also provide low substrate current programming suitable for low power applications by using Fowler-Nordheim tunneling for both program and erase operations. While the operation of the present invention will be described in terms of an n-p-n device, it should be recognized that the operation of a pnp device is also possible by biasing the electrodes with an opposite polarity. All cells in a npr device may be globally programmed by positively biasing trenched control gate electrode 222 and grounding all other nodes, i.e. buried drain region 208, and buried source region 206 and substrate 202 so that channel region 204 is turned on. The result is an injection of electrons into trenched floating gate 218 through the vertical sidewall of trench 210 adjacent to buried drain region 208. Devices employing the principles of the present invention provide selective erasure of the individual cells in a device. The device is erased by negatively biasing trenched control gate electrode 222 so that channel region 204 is turned off, and positively biasing buried drain region 208 which permits a higher drain bias without generating excess leakage. Source region 206 and well junction region 203 are left floating. For unselected cells in an array, trenched control gate electrode 222 is grounded. The selective erase improves the erase efficiency of the device and controls and reduces device leakages and the sensitivity to over-erase problems. Devices embodying the principles of the present invention are read by positively biasing trenched control gate electrode 222 and drain region 208, and grounding source region 206 and well junction region 203.

Devices embodying the principles of the present invention may also be used for high speed applications by using hot carrier injection for programming the device and Fowler-Nordheim techniques for erasing the device. Individual cells can be selectively programmed by positively biasing trenched control gate electrode 222 and drain region 208 and grounding source region 206 and well junction region 203. The trenched control gate electrode 222 of unselected cells in an array are grounded. The device may be globally erased by either grounding or negatively biasing trenched control gate electrode 222 and positively biasing all other nodes.

Figure 2C:
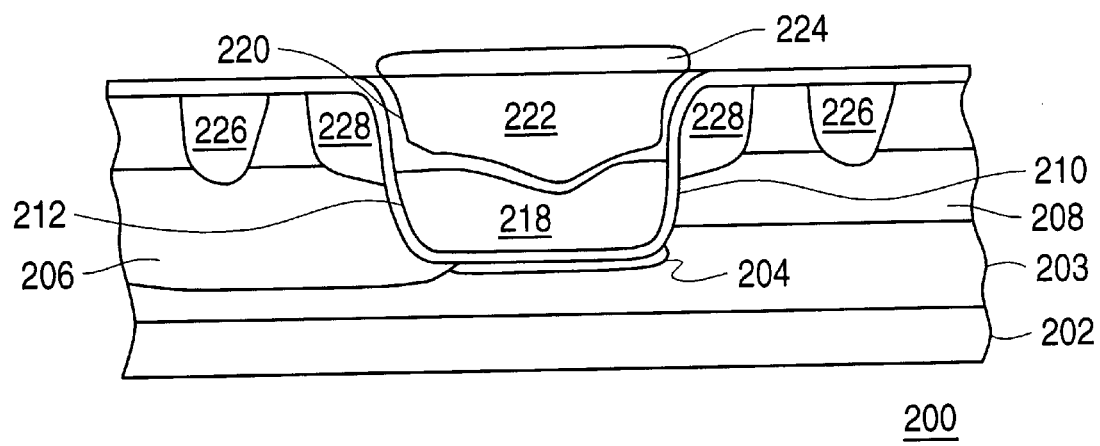

FIG. 2C is another embodiment of the present invention including sidewall dopings. In such embodiment, sidewall dopings 228 are formed in the semiconductor substrate by implanting the substrate at a large angle, preferably 15 to 75 degrees, in conventional manner with dopant impurities of one conductivity type. The convention for determining the angle of an implant is relative to the axis which is normal to the top surface of the substrate. In other words, 0 degrees refers to an implant along the axis which is normal to the top surface of the substrate and 90 degrees refers to an implant which is parallel to the top surface of the substrate. Sidewall dopings 228 are immediately contiguous the upper vertical sidewalls of trench 210 and the substrate surface, as shown in FIG. 2C. The depth of sidewall dopings 228 is approximately equal to or greater than the depth of trenched control gate 222 but less than the depth of trench 210 to allow electrons to flow to and from buried drain region 208 and from and to trenched floating gate electrode 218 through the sidewalls of trench 210 for program and erase operations, and partially extend into buried source region 206 and buried drain region 208. Thus, sidewall dopings 228 are preferably deep enough to shield trenched control gate electrode 222 from buried source and buried drain regions 206, 208. Sidewall dopings 228 have a conductivity which is the same as the conductivity of well junction region 203.

Sidewall dopings 228 in accordance with the present invention minimize the sensitivity to misalignments between trenched control gate 222 and the buried source and buried drain regions 206, 208 by reducing the coupling between trenched control gate electrode 222 and buried source region 206 and buried drain region 208. Additionally, sidewall dopings 228 reduce leakages of electrons from the trenched gate electrodes through the sidewalls of the trench.

Figure 2D:
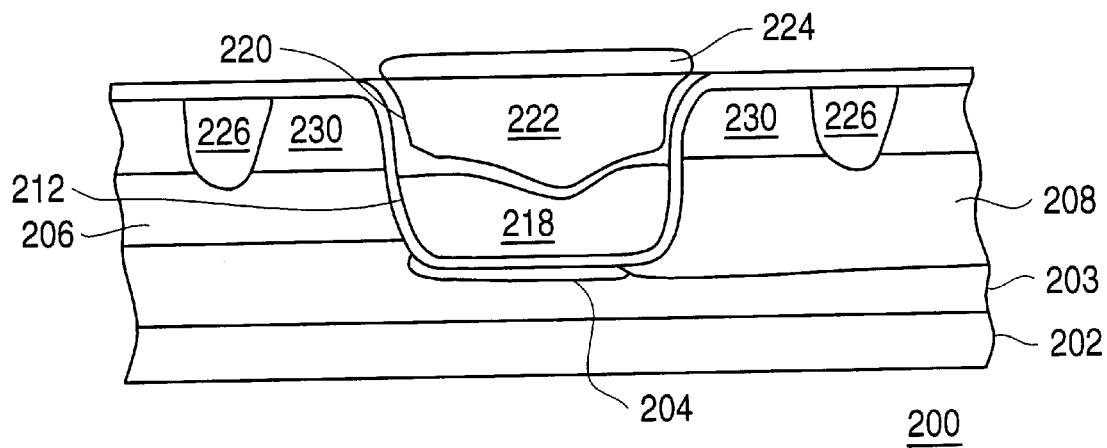

FIG. 2D is a cross-sectional view of yet another embodiment of the present invention. In such embodiment, an implanted region 230 preferably doped with "acceptor" or p-type impurities, is formed in the semiconductor substrate. Implanted region 230 is laterally separated by trench 210 and is immediately contiguous the vertical sidewalls of trench 210, the substrate surface and the upper boundaries of buried source region 206 and buried drain region 208 as shown in FIG. 2D. Implanted region 230 is formed in the semiconductor substrate by implanting the substrate in conventional manner preferably after trenched control gate 222 is formed. The depth of implanted region 230 is approximately equal to or greater than the depth of trenched control gate 222 and is determined by the ion implant used to form buried source region 206 and buried drain region 208. In other words, the upper boundary of buried source region 206 and buried drain region 208 is immediately contiguous to the lower boundary of implanted region 230. Thus, implanted region 230 is preferably deep enough to shield trenched control gate electrode 222 from buried source and buried drain regions 206, 208. Implanted region 230 is preferably doped with "acceptor" or p-type impurities, such as boron, and are formed using an ion implant in conventional manner with an implant dose range on the order of 1E12 atoms cm$^{-2}$ to on the order of 1E15 atoms cm$^{-2}$.

Implanted region 230 in accordance with the present invention minimizes the coupling between trenched control gate electrode 222 and buried source region 206 and buried drain region 208. Additionally, implanted region 230 reduces leakages of electrons from the trenched gate electrodes through the sidewalls of trench 210.

While the present invention has been described in terms of a simple device structure, it should be recognized that the underlying structure of the present invention may be coupled to other device structures or the common substrate in order to form an array for a semiconductor device, such as a memory array. Preferably, a layer of tungsten silicide or tungsten is used to interconnect the trenched control gates of multiple device structures in a semiconductor device. The method for forming the tungsten silicide or tungsten interconnects is described below in more detail with reference to FIG. 3I.

Figure 3A:
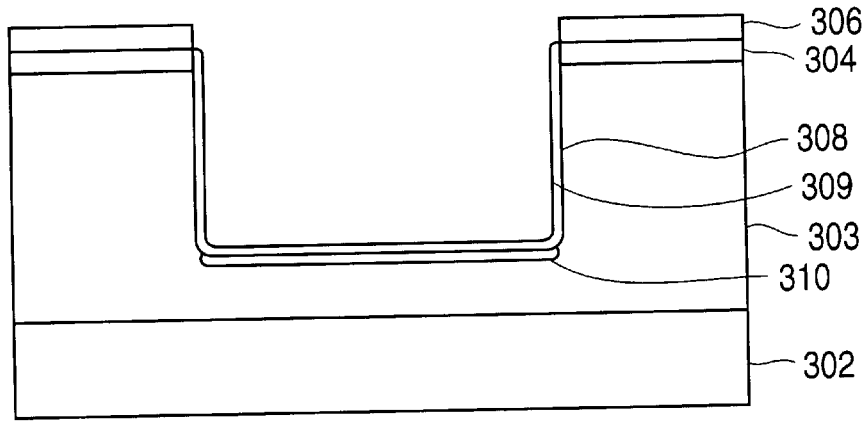
FIGS. 3A–3N are cross-sectional views of a semiconductor substrate in various stages of processing in accordance with one embodiment of the present invention.
Figure 3B:
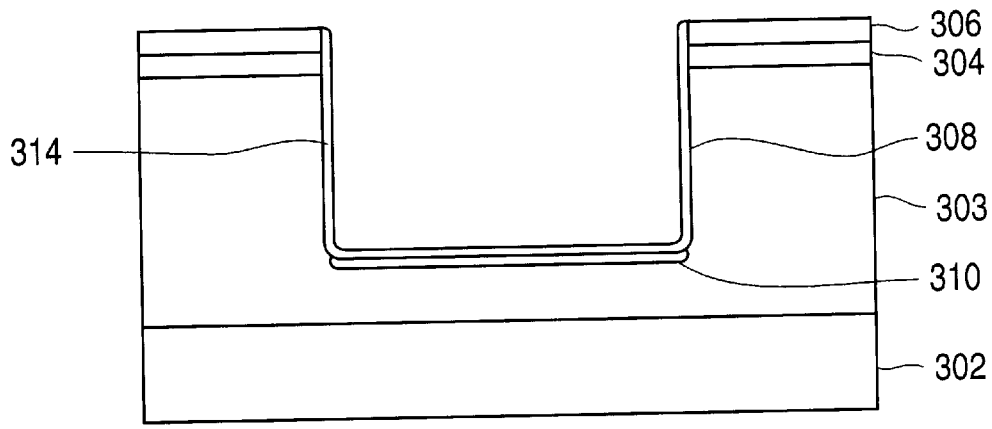
Figure 3C:
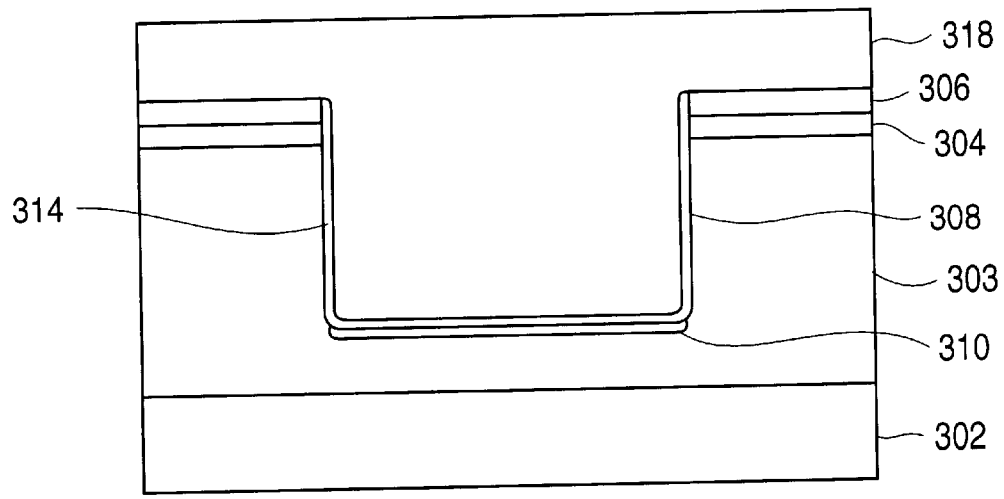
Figure 3D:
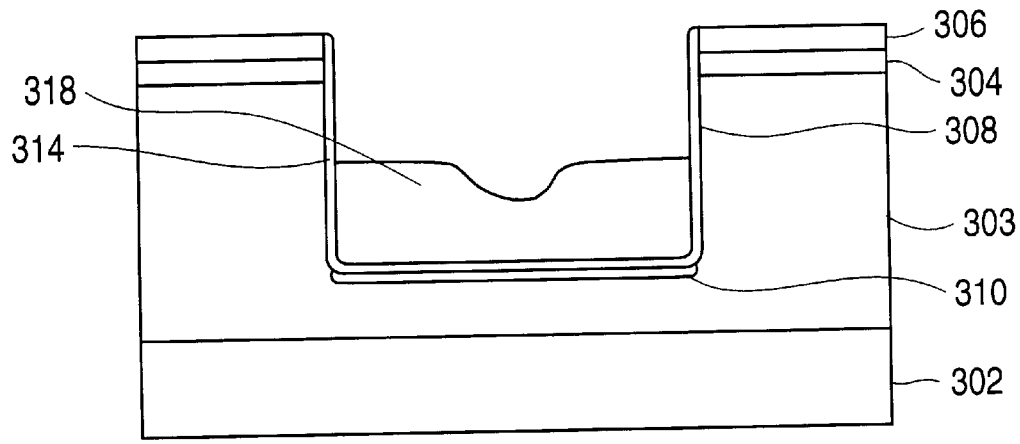
Figure 3E:
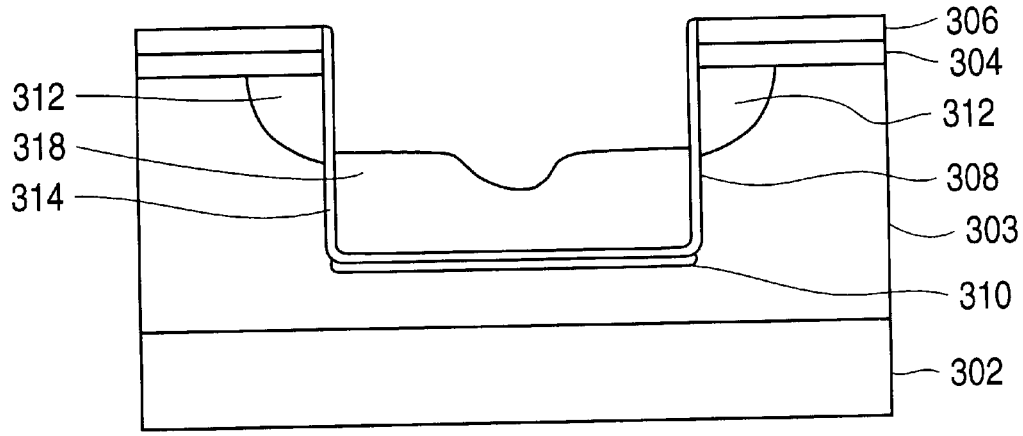
Figure 3F:
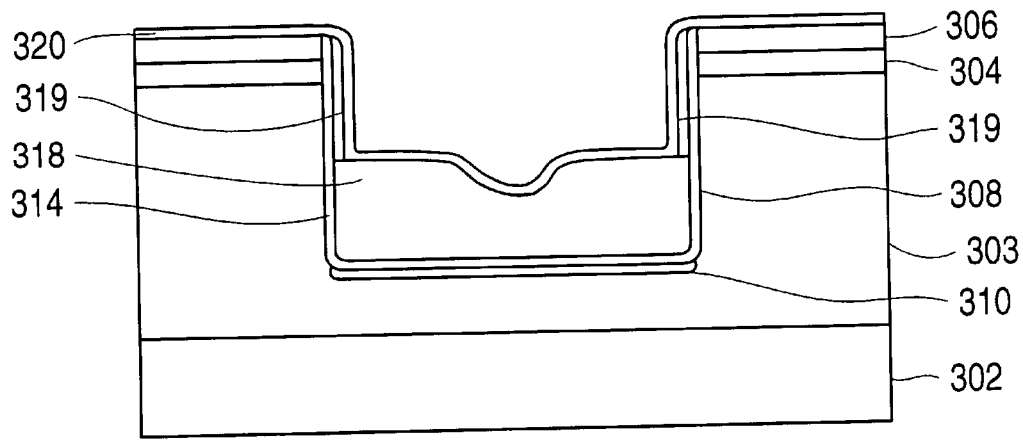
Figure 3G:
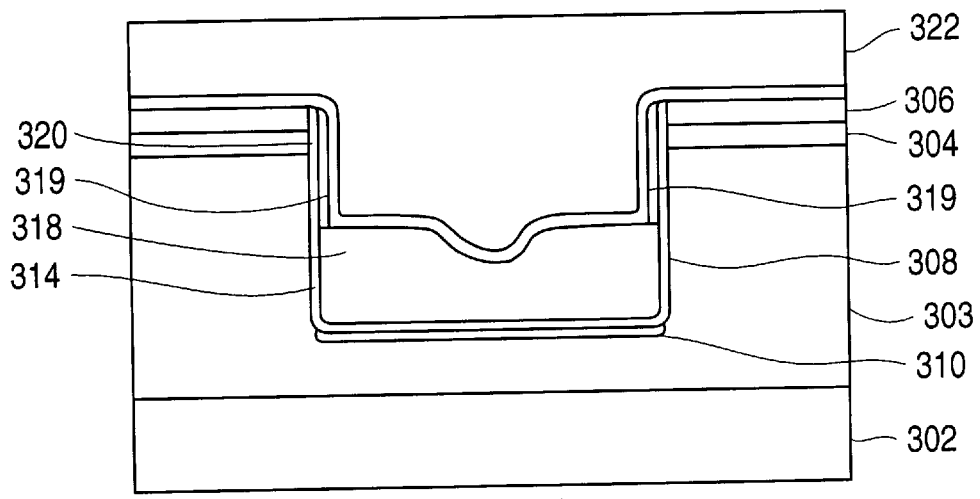
Figure 3H:
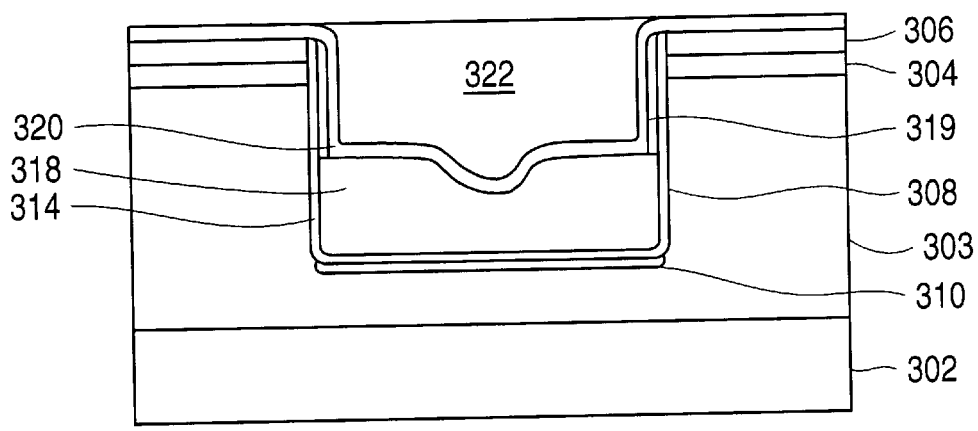
Figure 3I:
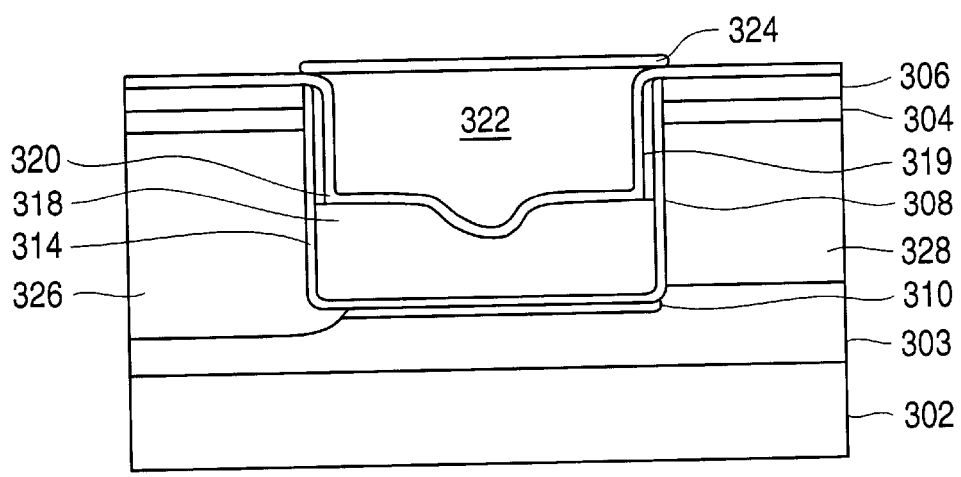
Figure 3J:
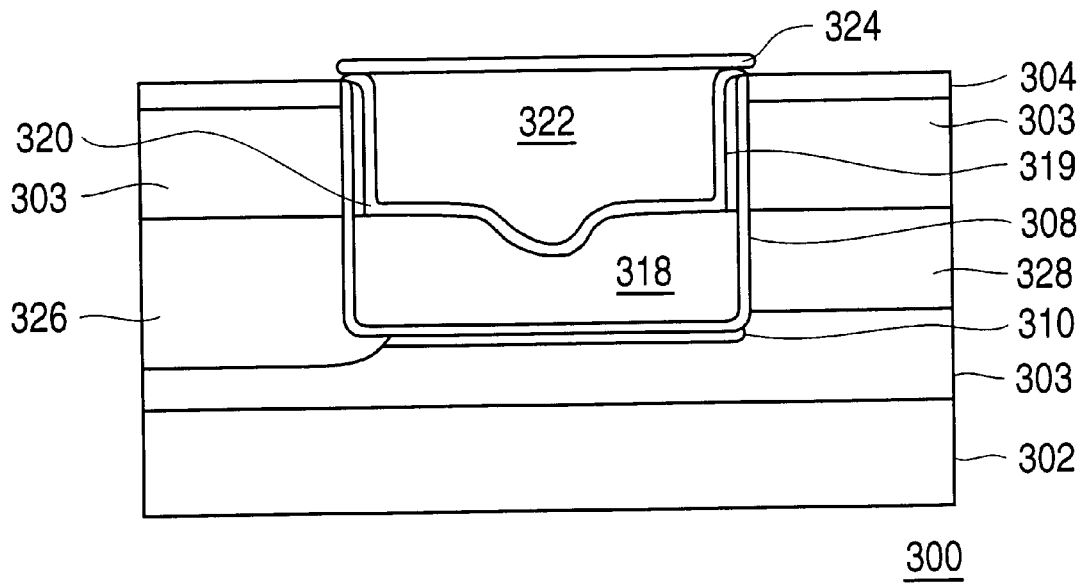
Figure 3K:
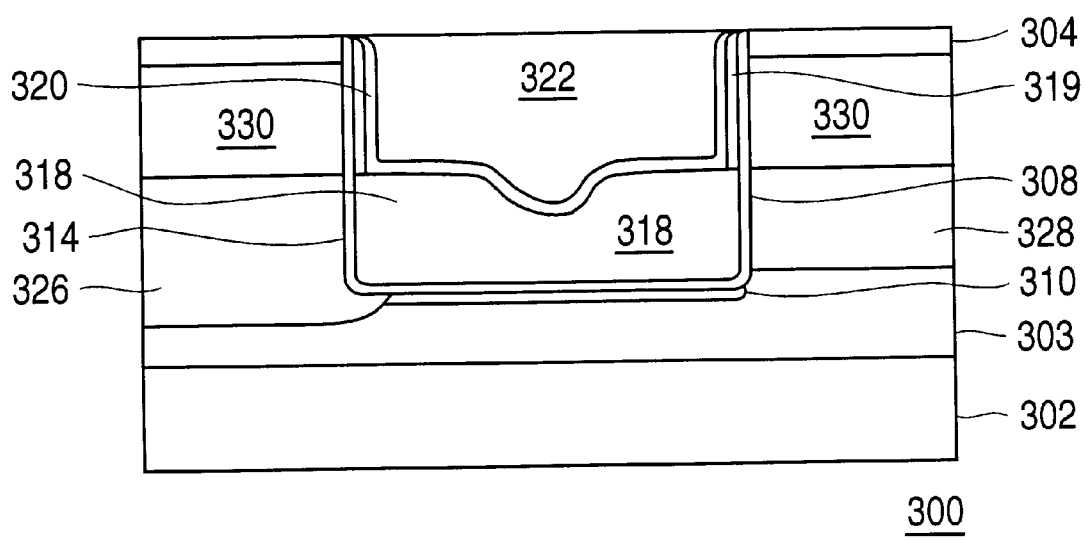
Figure 3L:
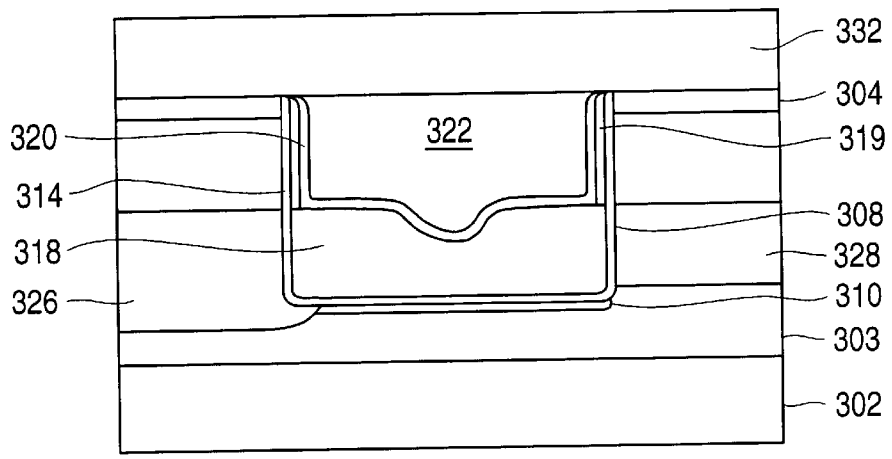
Figure 3M:
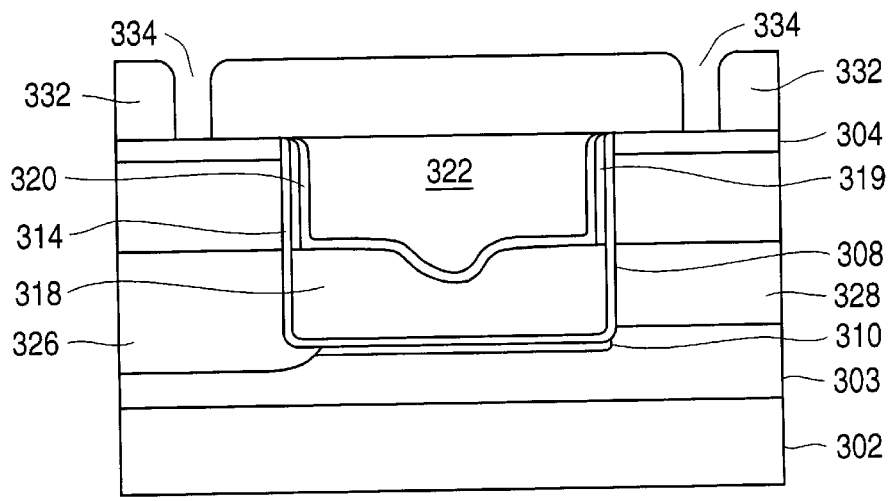
Figure 3N:
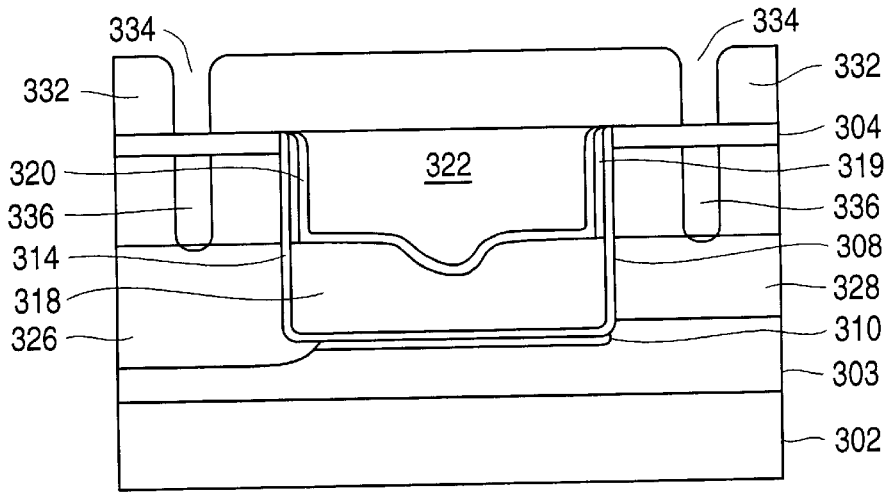

FIG. 3A–3N are cross-sectional views of the semiconductor substrate in various stages of processing in accordance with one embodiment of the present invention. While the present invention will now be described in terms of fabricating a single device structure, it should be recognized that the underlying process of the present invention may be employed to fabricate multiple devices on a single substrate. FIG. 3A is a cross-sectional view of a semiconductor wafer 300 comprising a substrate 302, a well-junction region 303, a first pad oxide layer 304, a nitride layer 306, a trench 308, a second pad oxide layer 309 and a channel region 310. The substrate 302 is preferably an n-doped silicon substrate cut from a single silicon crystal. Well junction region 303 is preferably p-doped. First pad oxide layer 304 is approximately 100 Å thick and provides stress relief between substrate 302 and nitride layer 306. Nitride layer 306 has a thickness of approximately 1500 Å and preferably comprises silicon nitride ($Si_3N_4$). Nitride layer 306 serves as a masking layer or etch stop for subsequent oxidation, chemical-mechanical polishing (CMP), and etching steps. The nitride layer 306 and oxide layer 304 sandwich can also be used as an isolation mask material. Thus, the steps for forming the fully recessed gate trench may be integrated into conventional CMOS process flows. First pad oxide layer 304 and nitride layer 306 may be deposited in conventional manner by chemical vapor deposition (CVD) or other techniques. Trench 308 is formed in conventional manner using a reactive ion etch (RIE) to remove the silicon substrate. The trench etching process may include multiple steps such as a nitride etch, an oxide etch and a high selectivity silicon to oxide etch. Second pad oxide layer 309 is grown in conventional manner inside trench 308. Preferably, second pad oxide layer 309 has a thickness of approximately 200 Å when trench 308 is approximately 3000 Å to 5000 Å wide. Channel region 310 is preferably formed using ion implantation of phosphorous in conventional manner with a dose range on the order of approximately 1E10 atoms $cm^{-2}$ to on the order of 1E13 atoms $cm^{-2}$ and an energy of approximately 1 keV to 60 keV at an angle of approximately 0 degrees in order to form a depletion type channel region to achieve a low threshold voltage. Alternatively, channel region 310 may be formed using an ion implantation of boron in conventional manner.

Next, a trench-to-gate dielectric layer is formed in trench 308 to isolate the trenched floating gate electrode from trench 308 to isolate the trenched floating gate from the trench 308. FIG. 3B is a cross-sectional view of semiconductor wafer 300 following formation of trench-to-gate insulating layer 314. In one embodiment, second pad oxide layer 309 may be removed in conventional manner prior to forming trench-to-gate insulating layer 314. Typically, an insulating layer, such as a layer of thermally grown or deposited oxide, preferably nitridized, is formed in conventional manner on the substantially upright vertical sidewalls and on the bottom surface inside trench 308. Preferably, the nitridized oxide has a K higher than about 4.0. Alternatively, trench-to-gate insulating layer 314 may be formed with a different thickness on the substantially upright vertical sidewalls inside trench 310 than the thickness on the bottom surface inside trench 310.

Semiconductor wafer 300 is then deposited with a layer of polysilicon 318 to form the trenched floating gate. FIG. 3C is a cross-sectional view of semiconductor wafer 300 following deposition of a layer of polysilicon 318. The thickness of polysilicon layer 318 is selected according to the depth of trench 308. In a preferred embodiment of the invention, the thickness of polysilicon layer 318 is between about 1000 Å and 10,000 Å. Typically, polysilicon layer 318 may be formed in conventional manner by low pressure chemical vapor deposition (LPCVD) and can be doped in situ in conventional manner.

Polysilicon layer 318 subsequently undergoes a polish, a plasma etch or a combination of a polish and plasma etch in conventional manner to remove portions of the polysilicon. FIG. 3D is a cross-sectional view of semiconductor wafer 300 following a plasma etch of polysilicon layer 318.

In one embodiment of the present invention, sidewall dopings are formed in the semiconductor substrate. After trenched floating gate 318 has been formed in trench 308, semiconductor wafer 300 is implanted with dopant impurities of one conductivity type to form sidewall dopings 312. FIG. 3E is a cross sectional view of semiconductor wafer 300 following implantation of sidewall dopings 312. Preferably, boron is implanted at a large angle around 15 to 75 degrees with a dose range on the order of approximately 1E13 atoms $cm^{-2}$ to on the order of 1E15 atoms $cm^{-2}$ and with an energy ranging from approximately 1 to 60 keV. Alternatively, sidewall dopings 312 may also be formed after forming inter-gate dielectric layer 320.

In a preferred embodiment, a trench sidewall spacer 319 is formed at the upper vertical surfaces of trench-to-gate insulating layer 314 inside trench 308 in order to further shield the trenched control gate electrode from the source and drain regions. Trench sidewall spacer 319 is immediately contiguous to both trench-to-gate insulating layer 314 and a portion of a top surface of trenched floating gate electrode 318. Inter-gate dielectric layer 320 is then deposited on wafer 300 to form an insulating layer on trenched floating gate electrode 318 and trench sidewall spacer 319 inside trench 308. FIG. 3F is a cross-sectional view of semiconductor wafer 300 after forming inter-gate dielectric 320. The inter-gate dielectric 320 is preferably an oxide-nitride-oxide (ONO) layer formed in conventional manner. In one embodiment, an additional spacer dielectric may be formed at the vertical sidewalls inside trench 308 in order to further shield the trenched control gate electrode from the source and drain regions. After inter-gate dielectric 320 has been formed over substrate 302 a second layer of polysilicon or a layer of polysilicide 322 is deposited in conventional manner to form the trenched control gate for non-volatile devices. FIG. 3G is a cross-sectional view of semiconductor wafer 300 after second layer of polysilicon 322 has been deposited. The final thickness of second polysilicon layer or layer of polysilicide 322 is approximately one half the depth of trench 308. Second layer of polysilicon 322 is subsequently planarized to remove portions of the polysilicon. FIG. 3H is a cross-sectional view of semiconductor wafer 300 following planarization of second layer of polysilicon 322. Second layer of polysilicon 322 is planarized by using conventional techniques such as a chemical-mechanical planarization (CMP) with nitride layer 306 acting as an etch stop.

After formation of trenched control gate 322, a layer of tungsten silicide 324 is formed on a top surface of trenched control gate 322. FIG. 3I is a cross-sectional view of semiconductor wafer 322 after formation of tungsten silicide 324 on trenched control gate 322. When connecting trenched control gate 322 to other device structures on the common substrate to fabricate a semiconductor device, such as a memory array, tungsten silicide layer 324 or a layer of tungsten can be patterned in conventional manner to interconnect multiple devices. During this process, oxide layer 304 and nitride layer 306 protect the other regions of the device structure. Tungsten silicide layer 324 on the top surface of trenched control gate 323 provides additional protection for trenched control gate 322 during the subsequent formation of the buried source region and the buried drain region. Thereafter, inter-gate dielectric layer 320 and nitride layer 306 outside the trenched gate region are removed in conventional manner.

Semiconductor wafer 300 then undergoes a deep implant in conventional manner with dopant impurities of one conductivity type to form a buried source region 326 and buried drain region 328. FIG. 3J is a cross-sectional view of semiconductor wafer 300 after formation of buried source region 326 and buried drain region 328. Preferably, multiple ion implantations of arsenic, phosphorous, or a combination of arsenic and phosphorous with a dose range on the order of 5E14 atoms $cm^{-2}$ to on the order of 1E16 atoms $cm^{-2}$ are performed at different implant energies. The upper boundaries of buried source region 326 and buried drain region 328 are approximately at the same depth as the top surface of the trenched floating gate. In one embodiment, buried source region 326 is formed using a corner-limiting diffusion process to form a lower boundary which partially extends laterally underneath the bottom surface of the trench to form a source junction disposed along portions of the lower sidewall and bottom of trench 308 while buried drain region 328 is implanted such that the lower boundary of buried drain region 328 is less than the depth of the trench. In another embodiment, buried drain region 328 is formed using a corner-limiting diffusion process to form a lower boundary which partially extends laterally underneath the bottom surface of the trench to form a drain junction disposed along portions of the lower sidewall and bottom of trench 308 while buried source region 326 is implanted such that the lower boundary of buried source region 326 is less than the depth of the trench. The corner-limiting diffusion process is primarily due to the corner effects of the trench, i.e., where the lower sidewall and bottom of the trench intersect. The source and drain implants are immediately contiguous the sidewalls of the trench with the deepest "as-implanted" dopant peak of the buried source and buried drain regions being disposed at substantially the same depth as the depth of the trench before a thermal anneal. During anneal, the lateral diffusion of buried source and buried drain junctions beneath the bottom surface of the trench is constrained by the amount of dopants available at the bottom corner, i.e., the intersection of the lower sidewall and bottom of the trench, and by the radial nature of the diffusion process. As a result, only a low percentage of dopant diffuses around the bottom corner of the trench, thus resulting in a corner-limiting process.

In another embodiment of the present invention, semiconductor wafer 300 is implanted with dopant impurities of one conductivity type to form implanted region 330. Implanted region 330 is formed by first performing a shallow implant in conventional manner with dopant impurities of one conductivity type, preferably p-type. FIG. 3K is a cross sectional view of semiconductor wafer 300 following a shallow implant. In one embodiment of the present invention, boron is implanted with a dose range on the order of approximately 1E12 atoms $cm^{-2}$ to on the order of 1E15 atoms $cm^{-2}$ and with an energy ranging from approximately 100 eV to 60 keV. The resulting implanted region is immediately contiguous the vertical sidewalls of the trench 308, the substrate surface and the upper boundaries of buried source region 326 and buried drain region 328.

Next, semiconductor wafer 300 is deposited in conventional manner with an interlayer dielectric 332. FIG. 3L is a cross-sectional view of semiconductor wafer 300 following deposition of interlayer dielectric 332. Interlayer dielectric 332 may be any number of films such as Tetra-Ethyl-Ortho-Silicate (TEOS), a high temperature oxide (HTO), or a low temperature oxide (LTO).

Interlayer dielectric 332 is then masked and etched in conventional manner to form contact openings. FIG. 3M is a cross-sectional view of semiconductor wafer 300 after forming contact openings 334. Contact openings 334 are preferably formed using an RIE etch in conventional manner.

After forming contact openings 334, preferably with the photoresist mask used for patterning still on the wafer, semiconductor wafer 300 is implanted through contact opening 334 with dopant impurities of one conductivity type to form contacts 336 to buried source region 326 and buried drain region 328. FIG. 3N is a cross-sectional view of semiconductor wafer 300 after formation of contacts 336 to buried source and buried drain regions 326, 328 and final formation of sidewall dopings 330. Finally, standard processing techniques are used to complete processing of semiconductor wafer 300.

What is claimed is:

1. A semiconductor device for low power applications formed in a semiconductor substrate having a top surface comprising:

a well junction region of one conductivity type formed in the semiconductor substrate;

a trench formed in the well junction region with substantially vertical sidewalls, a bottom surface, and a selected depth, the substantially vertical sidewalls comprising a first sidewall disposed on one side of the trench and a second sidewall disposed on an opposite side of the trench;

a buried source region of opposite conductivity type formed in the well junction region to form a source junction disposed along portions of the first sidewall and bottom of the trench, the buried source region having an upper boundary which is disposed below the top surface of the substrate;

a buried drain region of the opposite conductivity type formed in the well junction region to form a drain junction disposed along portions of the second sidewall, and having an upper boundary which is disposed below the top surface of the substrate and a lower boundary which has a depth that is approximately less than the selected depth of the trench;

a channel region formed beneath the bottom surface of the trench immediately contiguous the buried source region;

a trench-to-gate insulating layer formed on the sidewalls and on the bottom surface inside the trench;

a trenched floating gate electrode formed inside the trench and on the trench-to-gate insulating layer;

an inter-gate dielectric layer formed inside the trench on the trenched floating gate electrode; and a trenched control gate electrode formed inside the trench and on the inter-gate dielectric layer.

2. The semiconductor device of claim 1 wherein the trenched control gate electrode has a top surface, the top surface being substantially planar with the top surface of the semiconductor substrate.

3. The semiconductor device of claim 1 further comprising:

sidewall dopings of the opposite conductivity type formed in the buried source region and the buried drain region, the sidewall dopings being immediately contiguous upper substantially vertical sidewalls of the trench and the top surface of the semiconductor substrate, and partially extending into the buried source and buried drain regions.

4. The semiconductor device of claim 1 further comprising:

an implanted region formed in the semiconductor substrate and immediately contiguous upper substantially vertical sidewalls of the trench and the substrate surface.

5. The semiconductor device of claim 1 wherein the trenched control gate electrode is disposed to be selectively negatively biased in relation to the buried drain region for selectively erasing the device.

6. The semiconductor device of claim 1 wherein the trenched control gate electrode is disposed to be selectively positive biased in relation to all other nodes for globally programming the device.

7. The semiconductor device of claim 1 wherein the buried source region is formed by a self-limiting diffusion process.

8. A semiconductor device for low power applications formed in a semiconductor substrate having a top surface comprising:

a well junction region of one conductivity type formed in the semiconductor substrate;

a trench formed in the well junction region with substantially vertical sidewalls, a bottom surface, and a selected depth, the substantially vertical sidewalls comprising a first sidewall disposed on one side of the trench and a second sidewall disposed on an opposite side of the trench;

a buried drain region of opposite conductivity type formed in the well junction region with a drain junction which is disposed along portions of the first sidewall and bottom of the trench, the buried drain region having an upper boundary which is disposed below the top surface of the substrate;

a buried source region of the opposite conductivity type formed in the well junction region to form a source junction disposed along portions of the second sidewall, the buried source region having an upper boundary which is disposed below the top surface of the substrate and a lower boundary which has a depth that is approximately less than the selected depth of the trench;

a channel region formed beneath the bottom surface of the trench; the channel region being immediately contiguous the buried drain region;

a trench-to-gate insulating layer formed on the substantially vertical sidewalls and on the bottom surface inside the trench;

a trenched floating gate electrode formed inside the trench and on the trench-to-gate insulating layer;

an inter-gate dielectric layer formed inside the trench on the trenched floating gate electrode; and a trenched control gate electrode formed inside the trench and on the inter-gate dielectric layer.

9. The semiconductor device of claim 8 wherein the trenched control gate electrode has a top surface that is substantially planar with the top surface of the semiconductor substrate.

10. The semiconductor device of claim 8 further comprising:

sidewall dopings of the opposite conductivity type formed in the buried source region and the buried drain region immediately contiguous upper substantially vertical sidewalls of the trench and the top surface of the semiconductor substrate, and partially extending into the buried source and buried drain regions.

11. The semiconductor device of claim 8 further comprising:

an implanted region formed in the semiconductor substrate and immediately contiguous upper substantially vertical sidewalls of the trench and the substrate surface.

12. The semiconductor device of claim 8 wherein the device can be globally programmed by positively biasing the trenched control gate electrode and grounding all other nodes.

13. The semiconductor device of claim 8 wherein the device can be selectively erased by negatively biasing the trenched control gate electrode, positively biasing the buried drain region, and floating the buried source region and the substrate.

14. The semiconductor device of claim 8 wherein the buried drain region is formed by a self-limiting diffusion process.

* * * * *